United States Patent
Kanapka et al.

(10) Patent No.: US 8,892,416 B2
(45) Date of Patent: *Nov. 18, 2014

(54) SYSTEM AND METHOD OF GENERATING EQUATION-LEVEL DIAGNOSTIC ERROR MESSAGES FOR USE IN CIRCUIT SIMULATION

(71) Applicant: The MathWorks, Inc., Natick, MA (US)

(72) Inventors: Joseph Daniel Kanapka, Cambridge, MA (US); Nathan Edward Brewton, Wayland, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/887,796

(22) Filed: May 6, 2013

(65) Prior Publication Data

US 2013/0246025 A1    Sep. 19, 2013

Related U.S. Application Data

(63) Continuation of application No. 13/085,073, filed on Apr. 12, 2011, now Pat. No. 8,438,002, which is a continuation of application No. 11/891,498, filed on Aug. 10, 2007, now Pat. No. 7,925,488, which is a continuation of application No. 11/375,915, filed on Mar. 15, 2006, now Pat. No. 7,680,636.

(51) Int. Cl.
    *G06F 17/50*    (2006.01)

(52) U.S. Cl.
    CPC ................... *G06F 17/504* (2013.01)
    USPC .......................................................... 703/14

(58) Field of Classification Search
    USPC .......................................................... 703/14
    See application file for complete search history.

(56) References Cited

U.S. PATENT DOCUMENTS

| | | | |
|---|---|---|---|
| 4,386,403 A * | 5/1983 | Hsieh et al. ................... 716/111 |
| 5,025,402 A | 6/1991 | Winkelstein | |
| 5,168,457 A | 12/1992 | Karen et al. | |
| 5,410,496 A | 4/1995 | Bolon et al. | |
| 5,410,701 A | 4/1995 | Gopalraman | |
| 5,568,395 A | 10/1996 | Huang | |
| 5,920,490 A | 7/1999 | Peters | |

(Continued)

OTHER PUBLICATIONS

James, Douglas et al., "An Iterative Substructuring Algorithm for Equilibrium Equations," Numer Math., vol. 57:625-633 (1990).

(Continued)

*Primary Examiner* — Dwin M Craig
(74) *Attorney, Agent, or Firm* — Nelson Mullins Riley & Scarborough LLP

(57) ABSTRACT

A mechanism for providing equation-level diagnostic error messages for system models undergoing circuit simulations is discussed. The components in a model of a system being simulated are converted into multiple numerical equations where each equation corresponds to a component in the system being simulated or a topology equation for the system model. Each numerical equation is numerically analyzed in order to identify illegal configurations in the system. Upon detection of an error, an error message listing the components associated with the illegal configuration is generated for the user.

16 Claims, 7 Drawing Sheets

(56) References Cited

U.S. PATENT DOCUMENTS

| | | | |
|---|---|---|---|
| 5,933,356 | A | 8/1999 | Rostoker et al. |
| 6,063,126 | A | 5/2000 | Borduin |
| 6,536,026 | B2 | 3/2003 | Gullapalli |
| 6,988,241 | B1 | 1/2006 | Guttman et al. |
| 7,131,080 | B2 | 10/2006 | Chen et al. |
| 7,428,477 | B1 | 9/2008 | Phillips et al. |
| 7,680,636 | B2 | 3/2010 | Kanapka et al. |
| 7,925,488 | B2 | 4/2011 | Kanapka et al. |
| 8,438,002 | B2 * | 5/2013 | Kanapka et al. ............ 703/14 |
| 2006/0095870 | A1 * | 5/2006 | Tai et al. ...................... 716/1 |

OTHER PUBLICATIONS

Singh, Deshanand P. et al., "Integrated Retiming and Placement for Field Programmable Gate Arrays," FPGA'02, 24-26, 2002, Monterey, California, USA, pp. 67-76 (2002).

Nguyen, Tuyen V. et al., "State Transformation in Event Driven Explicit Stimulation," Proceedings of the 1997 IEEE/ACM International Conference on Computer-Aided Design, ICCAD '97, pp. 289-294 (1997).

European Search Report for Application No. 10196970.7, 5 pages, dated Mar. 17, 2011.

* cited by examiner

SYSTEM AND METHOD OF GENERATING EQUATION-LEVEL DIAGNOSTIC ERROR MESSAGES FOR USE IN CIRCUIT SIMULATION

RELATED APPLICATION

This application claims the benefit under 35 U.S.C. §120 as a continuation of U.S. Pat. No. 8,438,002, issued May 7, 2013, entitled "System And Method Of Generating Equation-Level Diagnostic Error Messages For Use In Circuit Simulation," which is a continuation of U.S. Pat. No. 7,925,488, issued Apr. 12, 2011, entitled "System And Method Of Generating Equation-Level Diagnostic Error Messages For Use In Circuit Simulation," which is a continuation of U.S. Pat. No. 7,680,636, issued Mar. 16, 2010, entitled "System And Method Of Generating Equation-Level Diagnostic Error Messages For Use In Circuit Simulation," the entire disclosures of which is hereby incorporated by reference for all purposes.

FIELD OF THE INVENTION

The illustrative embodiment of the present invention relates generally to circuit simulation and more particularly to a mechanism for generating equation-level diagnostic error messages based on a numerical analysis of equations associated with model components in a system being simulated.

BACKGROUND

Circuit simulators attempt to diagnose illegal configurations in system models with a network topology that are being simulated and then present the information about the illegal configuration to a user. An example of an illegal configuration in a system is a loop of independent voltage sources that violates Kirchhoff's voltage law (the sum of voltages around the loop must be 0; which is not the case when the loop has multiple independent voltage sources). Ideally, an error message will identify all of the components involved in the illegal configuration for a user. Conventional mechanisms for accomplishing the diagnosis of illegal configurations include performing structural analysis of equations associated with the components in the system being simulated and techniques that require the categorization of the components into five separate classes prior to analysis.

Unfortunately, the conventional mechanisms for diagnosing illegal configurations in systems being simulated suffer from a number of drawbacks, especially in the area of multi-domain circuit simulation. Certain systems are not particularly amenable to having their components categorized into five classes (voltage sources, capacitors, resistors, inductors and current sources) prior to analysis, and for these systems, categorization is either impossible or forces the system designer/user performing simulation to make awkward categorization choices. The inability to properly categorize the system components leads at best to a significantly less accurate diagnosis of the system. The other conventional mechanism that is frequently used, structural analysis, simply does not properly diagnose all types of illegal configurations with which the user may be concerned.

BRIEF SUMMARY

The illustrative embodiment of the present invention provides equation-level diagnostic error messages for system models undergoing circuit simulation. Circuit simulation in the present invention may be performed on system models that include a network topology. The system models may represent different types of domains such as electrical, hydraulic and mechanical and may include components from more than one type of domain in a single model (a multi-domain model). The components in a model of a system being simulated are converted into multiple numerical equations where each equation corresponds to a component in the system being simulated or a topology equation for the system model. Each numerical equation is numerically analyzed in order to identify illegal configurations in the system. Upon detection of an error, an error message listing the components associated with the illegal configuration is generated for the user. The present invention does not require pre-categorization of the model components and successfully detects illegal configurations not identifiable through conventional structural analysis techniques.

In one aspect of the present invention, a method for identifying equation-level errors in a system model used in circuit simulation includes the step of providing a representation of the structure of a system model to be simulated, the system model including multiple system model components. The method converts the representation of the structure of the system to multiple numerical equations with each numerical equation corresponding to a system model component or a topology equation for the system model. The method additionally identifies at least one illegal configuration in the system model by performing a numerical analysis of at least one of the numerical equations.

In another aspect of the present invention a system for identifying equation-level errors in a system model used in a circuit simulation includes a representation of the structure of a system model to be simulated. The system model includes multiple system model components. The system model also includes multiple numerical equations with each numerical equation corresponding to a system model component or a topology equation for the system model. Additionally, the system includes an analysis facility for identifying an illegal configuration in the system model that performs a numerical analysis of the numerical equations.

In one aspect of the present invention, a distributed system for identifying equation-level errors in a system model used in circuit simulation includes a first computing device accessed by a user. The first computing device communicates over a network with a second computing device. The system also includes the second computing device which supports a circuit simulation environment. The circuit simulation environment includes a representation of the structure of a system model to be simulated and an analysis facility. The representation of the structure of the system includes representations of multiple system model components that are converted into a plurality of numerical equations. Each numerical equation corresponds to a representation of a system model component in the representation or to a topology equation. The analysis facility identifies an illegal configuration in the system model by performing a numerical analysis of the numerical equations. The system additionally includes a display device in communication with the first computing device that is viewable by the user. The display device displays either an error message generated in the circuit simulation environment that identifies at least one component involved in the illegal configuration or it displays a graphical representation of the system model that includes at least one indicator associated with a system model component that is identified as involved in the illegal configuration.

In an aspect of the present invention, a method for identifying equation-level errors in a system model used in circuit simulation includes the step of providing a representation of the structure of a system model to be simulated, the system model including multiple system model components. The method converts the representation of the structure of the system model to multiple numerical equations with each numerical equation corresponding to a system model component or a topology equation for the system model. The method additionally identifies at least one illegal configuration in the system model, by performing a symbolic analysis of at least one of the numerical equations. An error message is generated by the method that identifies at least one of the system model components involved in the illegal configuration.

In another aspect of the present invention, a method for identifying equation-level errors in a system model used in circuit simulation includes the step of providing a representation of the structure of a system model to be simulated. The system model includes multiple system model components. The method also converts the representation of the structure of the system model to multiple numerical equations that each correspond to an equation associated with the system model. Additionally, the method identifies at least one illegal configuration in the system model by performing a numerical analysis of at least one of the numerical equations.

BRIEF DESCRIPTION OF THE DRAWINGS

The invention is pointed out with particularity in the appended claims. The advantages of the invention described above, as well as further advantages of the invention, may be better understood by reference to the following description taken in conjunction with the accompanying drawings, in which:

DETAILED DESCRIPTION

Multi-domain systems that have components from different domains such as electrical, hydraulic and mechanical domains have proven difficult to analyze for illegal circuit configurations using conventional techniques. The illustrative embodiment of the present invention provides a mechanism for translating component descriptions written in domain-specific languages into corresponding numerical equations. The equations are numerically analyzed in order to identify illegal circuit configurations. Components involved in the illegal configuration are then identified for the user via error messages listing the components or by providing indicators in a graphical representation of the model being simulated.

Figure 1:
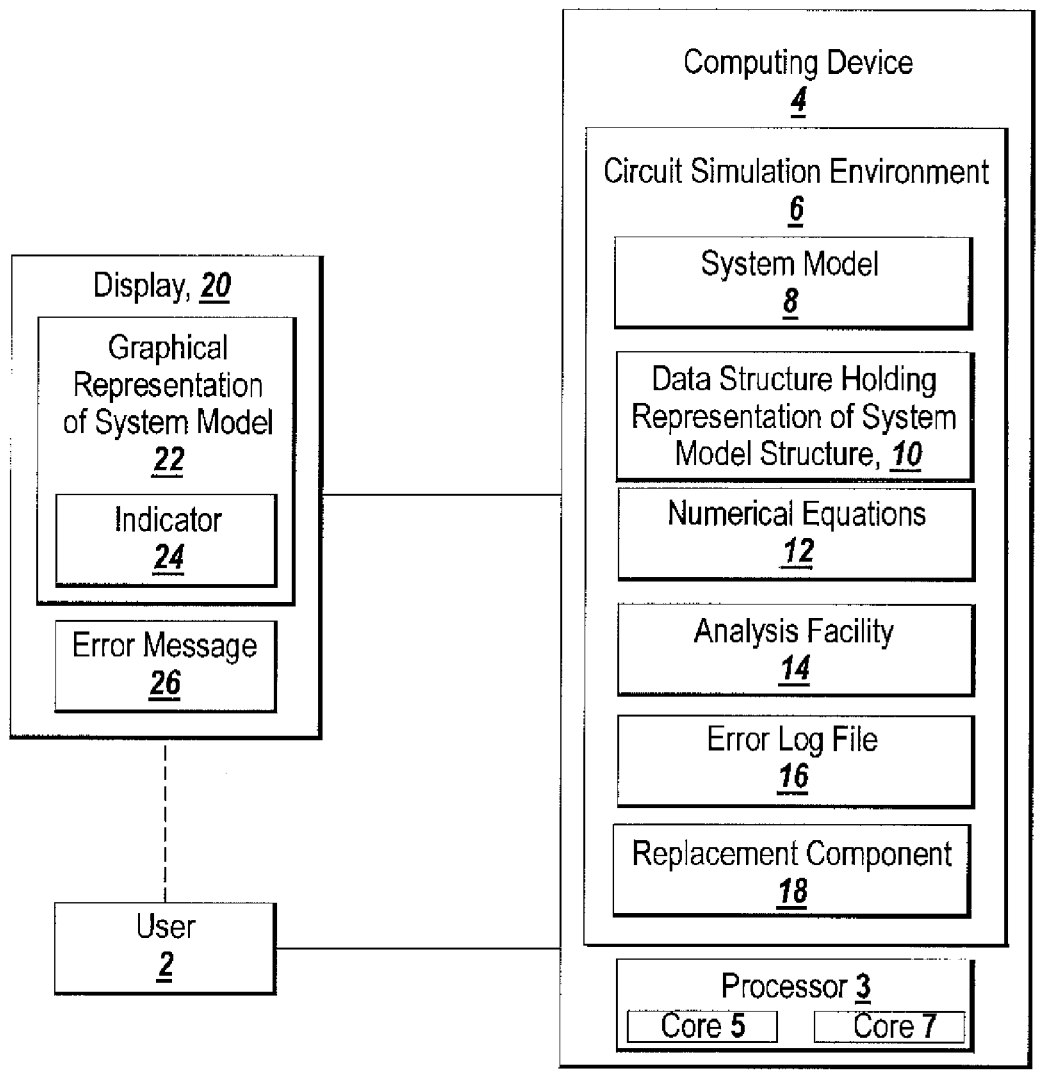
FIG. 1 depicts an environment suitable for practicing the illustrative embodiment of the present invention.

FIG. 1 depicts an environment suitable for practicing the illustrative embodiment of the present invention. A computing device 4 that is accessible by a user 2 communicates with a display 20. The computing device 4 may be a PC, workstation, server, laptop, mainframe, PDA or other computing device equipped with a processor and capable of hosting the circuit simulation environment 6. The computing device 4 may be a virtualized device. The computing device 2 may be equipped with a single processor, a multi-core processor, or multiple processors. By way of example, FIG. 1 shows a processor 3 with multiple cores 5 and 7. The processor may be a 32 bit processor, 64 bit processor or some other type of processor capable of executing the instructions required for the present invention.

The computing device 4 hosts a circuit simulation environment that is used to simulate the execution of a system model 8. An exemplary circuit simulation environment 6 is SIMDRIVELINE or SIMHYDRAULICS working in conjunction with MATLAB and SIMULINK, all from The MathWorks, Inc. of Natick, Mass. The components of the system model 8 are represented in a representation 10 such as a graph that holds information about the structure of the system being modeled. The components represented in the graph or other representation 10 are converted from the high-level domain-specific language of the system model 8 to numerical equations 12. Each numerical equation 12 is associated with a particular component of the system model 8 that is represented in the graph 10.

An analysis facility 14 is utilized by the circuit simulation environment 6 to numerically analyze the numerical equations 14. A number of different types of numerical analysis may be performed including techniques based on sparse QR and reduced-row-echelon form.

The present invention requires a technique for factoring an n by n matrix A into A=E*B, where E is of full column rank and B is in staircase upper-triangular form. While E must have full column rank it does not have to be explicitly computed. An example of staircase upper-triangular form is given in the table below.

| X | ? | ? | ? | ? | ? | ? |
|---|---|---|---|---|---|---|
| 0 | X | ? | ? | ? | ? | ? |
| 0 | 0 | 0 | X | ? | ? | ? |
| 0 | 0 | 0 | 0 | 0 | 0 | X |

In the table, 'X' represents a definitely nonzero entry, '0' represents a zero entry, and '?' indicates that the value of the entry may be zero or nonzero. The term "staircase form" indicates that each column's highest-row-index nonzero entry has a row index at most 1 larger than the row index of the previous column's highest-row-index nonzero entry, except in the case of the first column, which must be either all '0' values or have exactly one nonzero entry (which must be at row index 1). As discussed herein the staircase matrix is required to have at least one nonzero entry in each row. The columns in which the highest-row-index nonzero entry has a row index equal to 1 larger than the maximum row index of all nonzero entries in all preceding columns play a special role and will be referred to as the step columns.

Two techniques which provide the desired form of analysis are sparse QR decomposition and transformation to reduced-row echelon form. In sparse QR, a sparse A produces a sparse R such that A=Q*R (within some error tolerance) where Q is composed of orthogonal columns and R is staircase upper-triangular. (Reduced QR, is used to produce an R without zero rows.) A transformation to reduced row-echelon form produces an 'E' such that A=E*B, where E is nonsingular, B is in staircase upper-triangular form and the step columns form the order-n identity matrix. (To get E and B into the form needed from reduced-row echelon form, one needs to remove zero rows of B and remove the corresponding columns of E. E may then be non-square but will still have full column rank.) Implementations of these analysis techniques are available in many commercial and public-domain software packages.

The numerical analysis is performed in order to determine whether each equation is independent of all of the previously processed equations. Any dependency detected indicates an illegal configuration in the system being modeled since the circuit equation systems are expected to be square and have non-singular Jacobians. The indices of nonzero coefficients in the dependency indicate to the analysis facility which equations are involved.

For example, when solving a system of nonlinear equations, size m×n, whose Jacobian df/dx is provided by the simulation environment, denote the system by f(x)=0, where x is a vector of n components (typically the system state vector) and f(x) is the vector of function residuals, of length m. This form describes the DC (steady-state) problem as well as other problems of interest (such as the Initial Conditions solve in SIMHYDRAULICS). Define J(x_0)=df/dx(x_0) for an arbitrary x_0. If there is a dependency in the rows of J, this indicates a possible dependency or inconsistency in the equations of f. Then define A=J(x_0)^T (transpose of J(x_0)). The rows of J correspond to equations of f, which are either topology equations or component equations. Each column of A is thus associated with either a topology equation or a component equation and is used to generate diagnostic messages relating back to the components. The generation of the diagnostic messages is discussed further below.

The association of the columns of A with a topology equation or component equation is now described in greater detail. If A=E*B as in the notation above B_i may be defined to be the step columns of B, B_d may be defined to be the rest of the columns of B, and A_i and A_d may be defined to be the corresponding columns of A. It should be noted that B_i is invertible since B is in staircase form. Then E*B_d=A_d and E*B_i=A_i. Writing A_d=E*B_d=E*B_i*(inv(B_i)*B_d), we find A_d=A_i*(inv(B_i)*B_d). Columns of A_i are linearly independent since E is of full column rank and B_i is nonsingular. It should also be noted that the B_d may be empty (all the columns of B are independent)—in this case there is no illegal configuration to report. Thus the dependent columns of A (A_d), corresponding to dependent Jacobian rows, are expressed in terms of the independent columns of A (A_i) through (inv(B_i)*B_d). Each column of (inv(B_i)*B_d) thus gives information on a dependency. The indices of nonzero entries of (inv(B_i)*B_d) are the indices of Jacobian rows involved in the dependency. In practice, a small tolerance value should be selected and entries below this threshold in (inv(B_i)*B_d) changed to 0.

The technique described above can also be used to analyze systems for possible problems in transient analysis. In particular, many ODE integrators cannot handle systems of differential index >1. Consider the system (M_d 0;0 0)*x'=(f_1(x);f_2(x)), where M_d is diagonal of size n_d by n_d and the whole matrix on the left-hand-side is of size n×n. This system is by definition of index >1 exactly when the matrix C=(M_d 0;df_2/dx) is nonsingular for almost all x. Potential problems may thus be identified with the transient simulation by taking A=C' and applying the technique described in the preceding paragraphs.

It should also be noted that the simulation environment may provide information on which equations are linear constant-coefficient (topology equations, and some other types of equations as well, i.e. linear resistors). This can be used to refine the diagnostic tool to only report dependencies involving only linear constant-coefficient equations, since these Jacobian rows will be dependent for all states x. Also, equations and variables may be scaled to improve the conditioning of A, thereby improving the reliability of the technique.

The analysis facility 14 generates an error message 26 for each identified illegal configuration. The error message may be displayed on the display 20 for viewing by the user. Alternatively, the error message may be written to an error log file 16 or similar record. In one implementation, the error message identifies only the components involved in the illegal configuration in the error message. Alternatively, the identified illegal configuration may be presented to the user via a graphical representation of the system model 22 that is displayed to the user. The analysis facility 14 may provide indicators 24 in the graphical representation of the system model 22 that are associated with the representations of the components involved in the identified illegal configuration.

The circuit simulation environment 6 may also include one or more possible replacement components 18 that may be used as substitutes for components in an identified illegal configuration. The use of replacement components 18 is discussed in further detail below.

Figure 2:
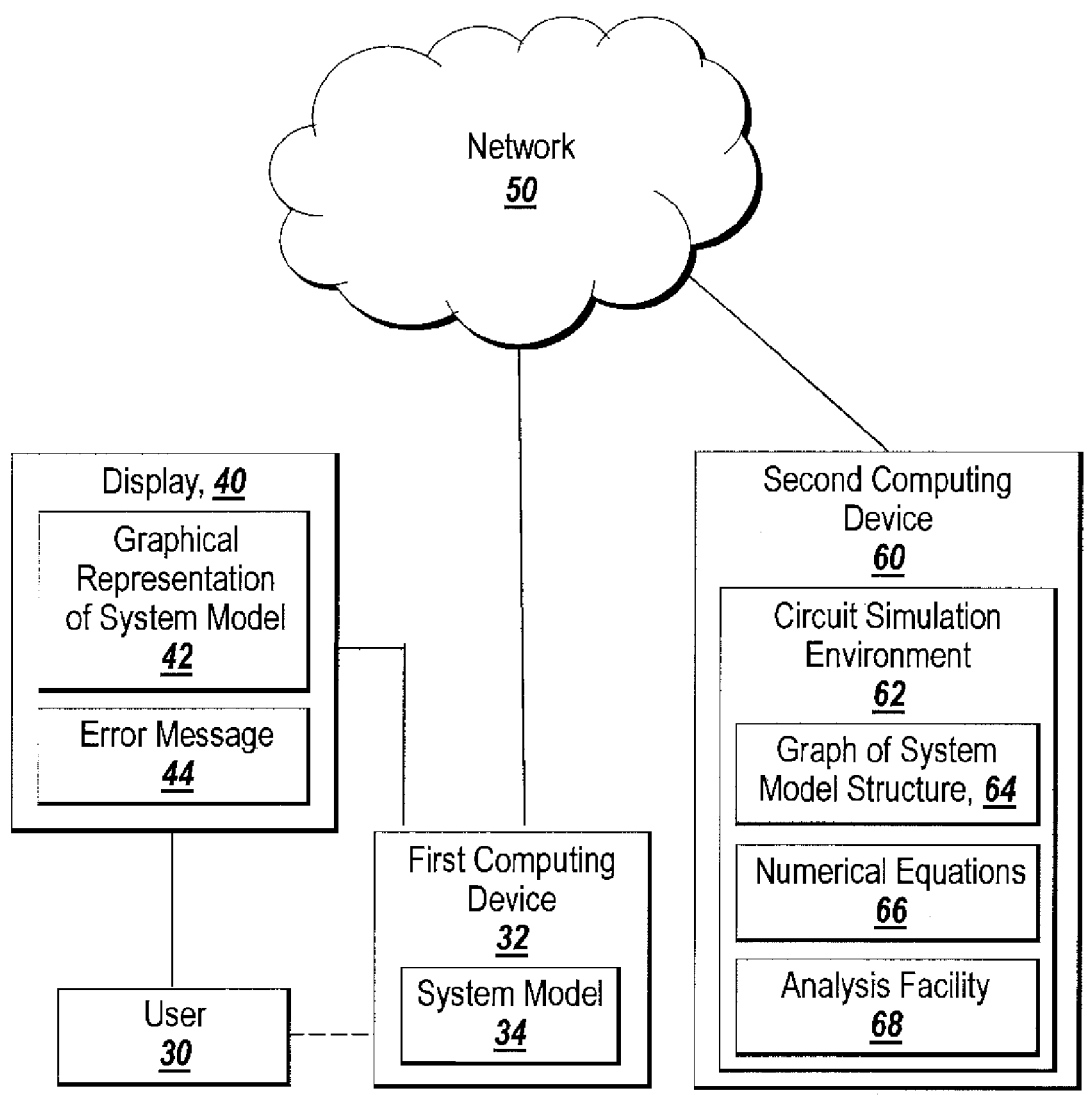
FIG. 2 depicts an alternate distributed environment suitable for practicing the illustrative embodiment of the present invention.

FIG. 2 depicts an alternative distributed environment suitable for practicing the illustrative embodiment of the present invention. A user 30 may utilize a first computing device 32 equipped with multiple processors 33 and 35 to communicate over a network 50 with a second computing device 60. The second computing device 60 and other components in the distributed architecture may be virtual components. The network 50 may be the Internet, a local area network (LAN), a wide area network (WAN), a wireless network, an intranet, an extranet or some other type of network.

The second computing device 60 may include a virtual machine 61 that supports a circuit simulation environment 62. The user may create or retrieve a system model 34 at the first computing device 32 and enter commands to send the model over the network 50 to the second computing device 60 for simulation. A graph 64 or other representation is created that represents the structure of the system model 34. Each of the components in the graph 64 is converted into a corresponding numerical equation 66. An analysis facility 68 numerically analyzes the numerical equations 66 in order to identify illegal configurations. The identified illegal configurations are conveyed to the user 30 via a graphical representation of the system model 42 that includes indicators that indicate components involved in the illegal configuration or through an error message listing the components involved. 44. Both the graphical representation of the system model 42 and the error message may be transmitted over the network 50 to the first computing device 32 so that they may be presented on the display 40 for the user to view. Alternatively, commands may be sent from the circuit simulation environment 62 on the second computing device 60 over the network 50 that cause the first computing device 32 to generate the error message 44 or graphical representation of the system model 42.

It will be appreciated by those skilled in the art that other distributed and parallel architectures enabling the execution of the invention described herein are also within the scope of the invention. For example, the system model 34 which is depicted in FIG. 2 as being located on the first computing device 32 may be located on the second computing device 60 or on a third computing device accessible over the network 50. Similarly, the circuit simulation environment 62 may be located on the first computing device 32 that is accessible to the user while the system model 34 is retrieved from the second computing device 60 that is accessed over the network 50. These and other configurations capable of the functionality discussed herein are considered within the scope of the present invention.

As noted above, one of the benefits of the present invention is that it performs a numerical analysis in order to identify illegal singularities in a system being simulated that would not be identifiable via a structural analysis. For example, consider the following set of equations representing a system:

$$v1=1$$

$$v2=2$$

$$v3=4$$

$$v1-e1+e2=0$$

$$v2-e2+e3=0$$

$$v3+e1-e3=0$$

This is an inconsistent system of equations since adding the first three equations and subtracting the last three equations from the result produces 0=7. Conventional structural analysis techniques look for a structural singularity in the equations (i.e., a singularity which exists independent of the values of nonzero coefficients in the linear system, but depends only on which coefficients are zero and nonzero.) Thus, the above system is structurally non-singular but is numerically singular. The illegal system of equations is identifiable with the present invention but not with conventional techniques relying on structural analysis. A simple example illustrating the importance of using a numerical technique is a voltage source connected in a loop with a resistor. The circuit is legal unless the resistance is zero. As a result the legality of the circuit depends on the numerical value of the resistance (performing this analysis post-compile is useful since the resistance value could be defined by other blocks in the model rather than just as a hard-coded constant).

Figure 3A:
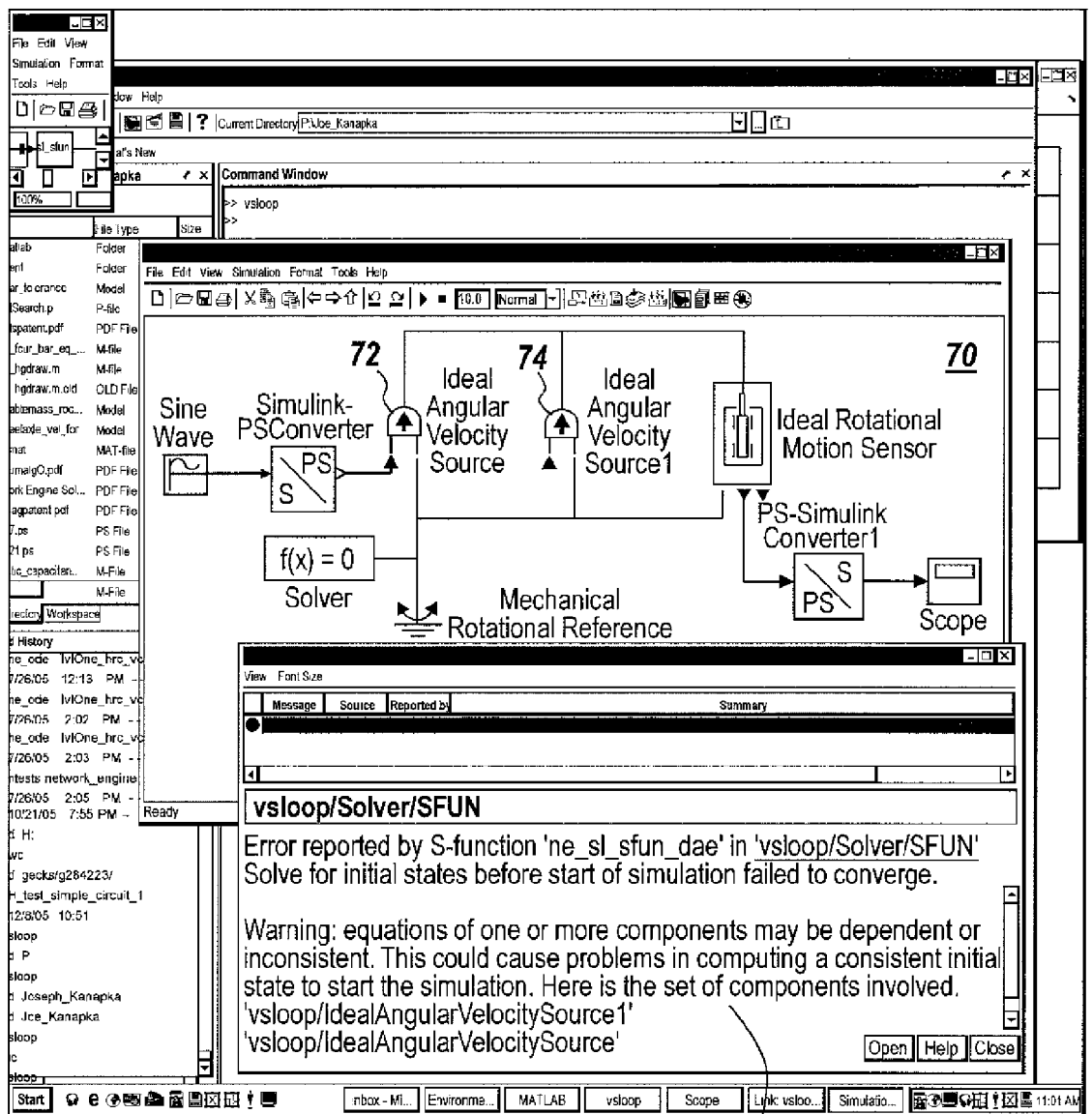
FIG. 3A is a screenshot of a block diagram of a system with an illegal configuration detectable by the present invention and the associated error message.
Figure 3B:
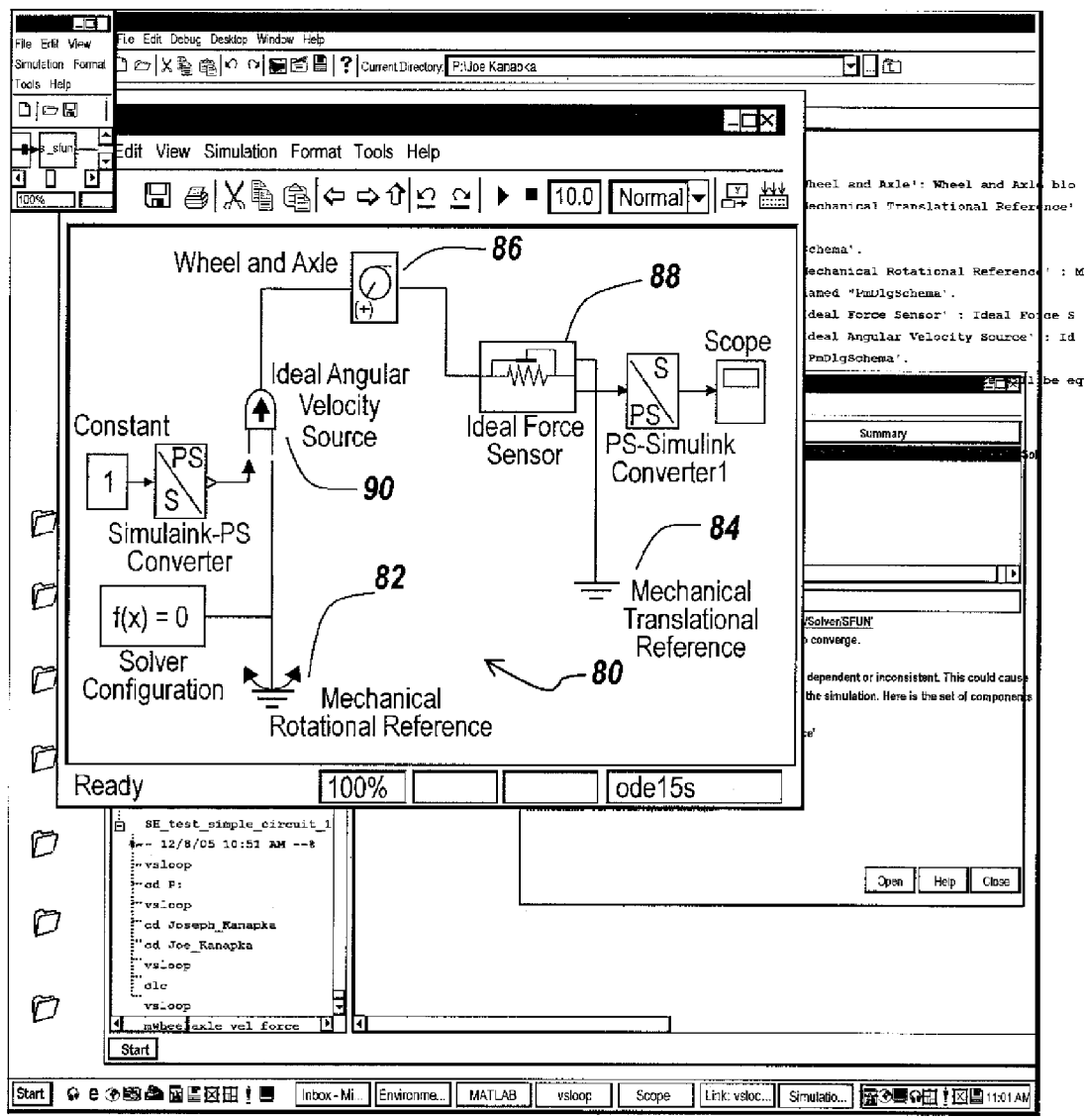
FIG. 3B is a screenshot of a block diagram of a multi-domain system with an illegal configuration detectable by the present invention and the associated error message.
Figure 3C:
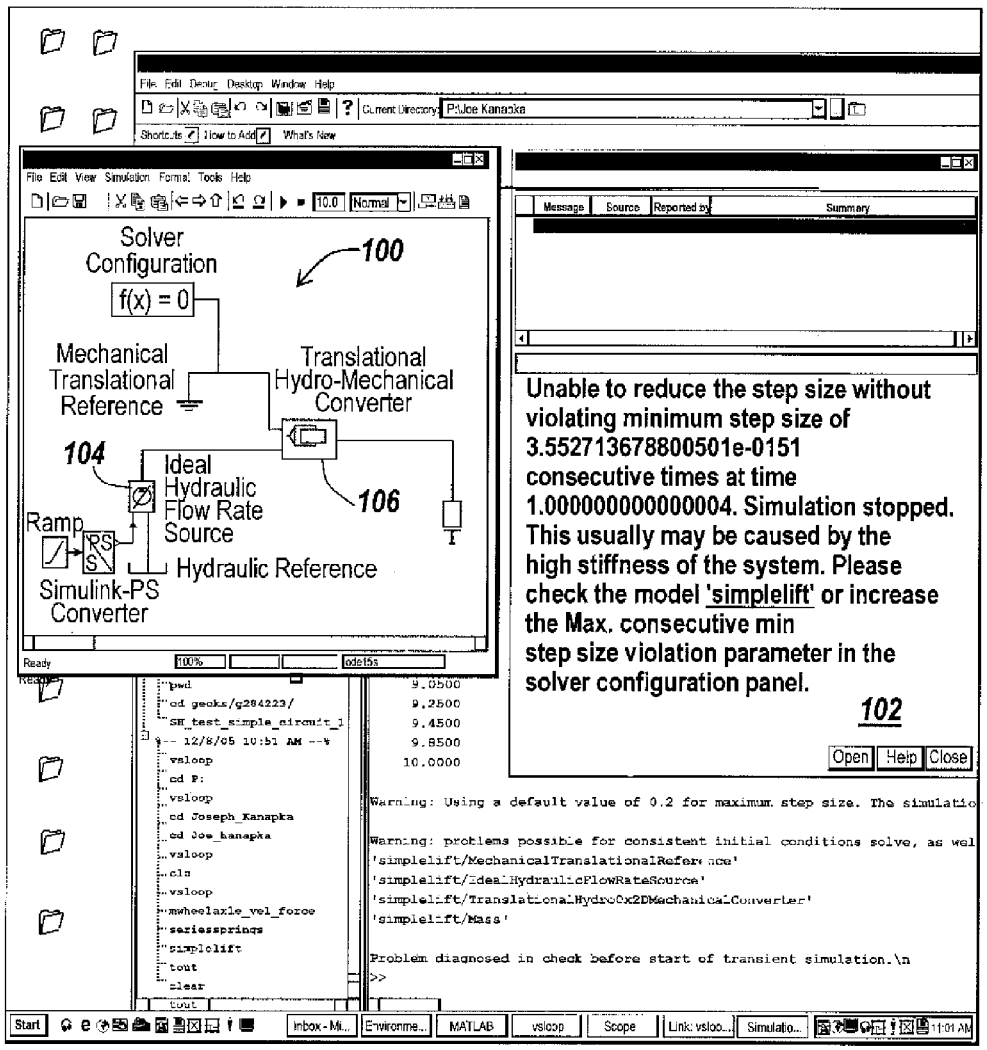
FIG. 3C is a screenshot of a block diagram of a system in which the illegal configuration causes a step size violation noted in an associated error message.

FIGS. 3A-3C provide illustrative examples of types of error detection provided by the present invention. FIG. 3A shows a system 70 which includes two velocity sources 72 and 74 which impose a relative velocity constraint across the same two nodes. By compiling a graph of the structure of the system into numerical equations which correspond to the system components, and then numerically processing the equations, the fact that both velocity sources are imposing a constraint on the same two nodes is identified. An error message 76 indicating the components involved in the illegal configuration is provided to the user.

FIG. 3B shows a multi-domain system with an illegal configuration detectable by the present invention. The two domains in the pictured system 80 are mechanical-rotational 82 and mechanical-translational 84, and the "transformer" between them is a wheel and axle component 86. The force sensor 88 is required to have a linear velocity of 0 across the sensor (analogous to a current sensor in an electrical circuit, which ideally has no resistance, i.e. a 0 voltage across the sensor). In the displayed system 80 however, the angular velocity source 90 converted through the wheel and axle 86 to a linear velocity, insists on a constant 1 for the velocity across the same two nodes. The incorrect placement of the force sensor is detected by the diagnostics of the present invention after compilation but before the time-domain (transient) solve starts. This type of multi-domain setting which may be analyzed by the present invention includes types of components that are not readily susceptible to categorization into the five classes typically used by conventional techniques to diagnose illegal configurations.

The illustrative embodiment of the present invention also allows more subtle problems to be diagnosed. It one implementation, the numerical analysis may reveal situations which are not illegal in the sense of creating an inconsistent set of algebraic equations, but may cause the solvers to fail or take extremely small timesteps (a higher index problem). An example is a capacitor-voltage source loop. Another variation can identify situations in which it might be possible to start the simulation from a specified initial state, but for which no steady-state (DC) solution is possible (i.e., a current source charging up a capacitor). FIG. 3C is a screenshot of a block diagram of a system 100 in which an illegal configuration causes a stepsize violation. When differential states are not truly independent, the solvers in the simulator may have problems (as shown by the minimum stepsize violation in the error dialog 102). In this case the differential state v (from $M*dv/dt=f$ in the mass) is actually algebraically related to the input (from the flow rate source 104), through the hydro-mechanical converter 106, which converts flow rate to velocity. The numerical analysis of the component equations performed by the present invention reveal the illegal dependency and trigger the identification of the illegal configuration.

It should be noted that the present invention may be implemented to diagnose illegal configuration either at the time of initialization of the model or at the time of simulation. While slower than diagnosing problems at the time of model initialization, the diagnosis of problems at the time of simulation allows the diagnosis of problems caused by model components which dynamically receive their values at the time of the simulation.

Figure 4:
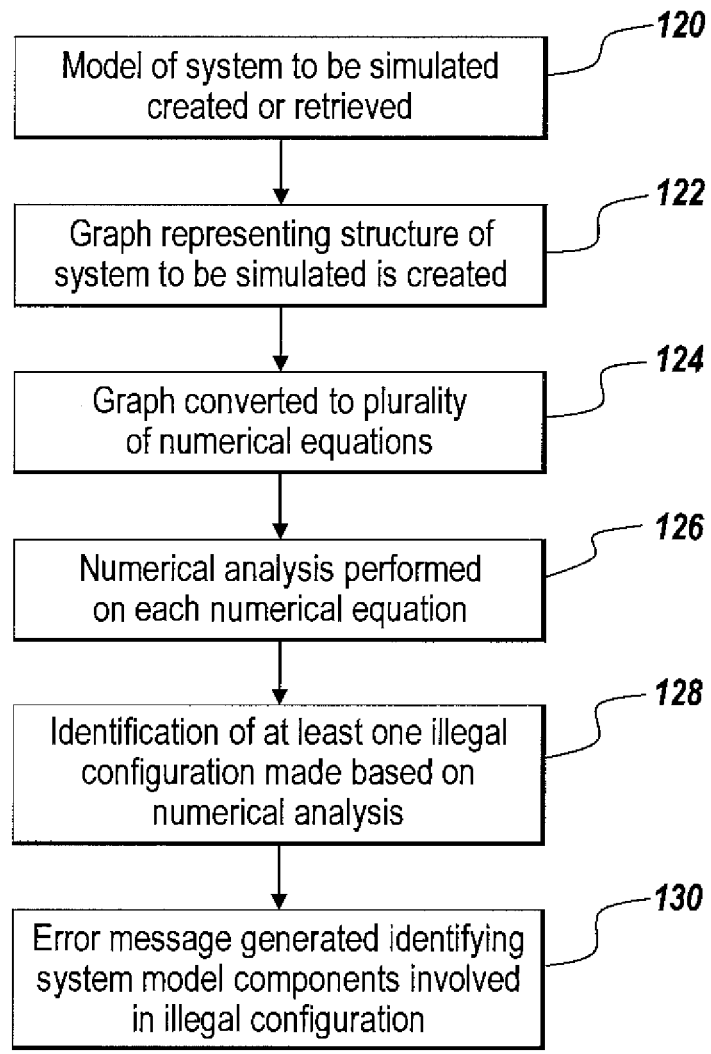
FIG. 4 is a flowchart of a sequence of steps followed by the illustrative embodiment of the present invention to identify illegal system configurations by using a numerical analysis.

FIG. 4 is a flowchart of a sequence of steps followed by the illustrative embodiment of the present invention to identify illegal system configurations by using a numerical analysis. The sequence begins with the model of a system to be simulated being created or retrieved (step 120). A graph or other representation that represents the structure of the system to be simulated is then created (step 122). The graph is compiled resulting in numerical equations that each correspond to a component in the system being modeled (step 124). A numerical analysis is performed on each numerical equation (step 126). Representative numerical analysis techniques include techniques based on sparse QR and reduced-row echelon form. A determination is made as to whether the system contains an illegal configuration (step 127). If an illegal configuration is not detected, the system may be simulated (step 128). If an identification of at least one illegal configuration is made based on the numerical analysis an error message is generated identifying the system model components involved in the illegal configuration (step 130). The error message may list the components involved in the illegal configuration. Alternatively, the user may be notified of the illegal configuration by way of indicators applied to a graphical representation of the system.

One aspect of the illustrative embodiment of the present invention allows for the replacement of problem components that have been found to cause simulation problems. "Safer" versions of components which experience has shown cause simulation problems are provided and associated with the original components so that the diagnostic engine may suggest replacements when illegal configurations are identified.

For example, in an electrical system a small resistance in series with voltage sources and in parallel with current sources would be added.

Figure 5:
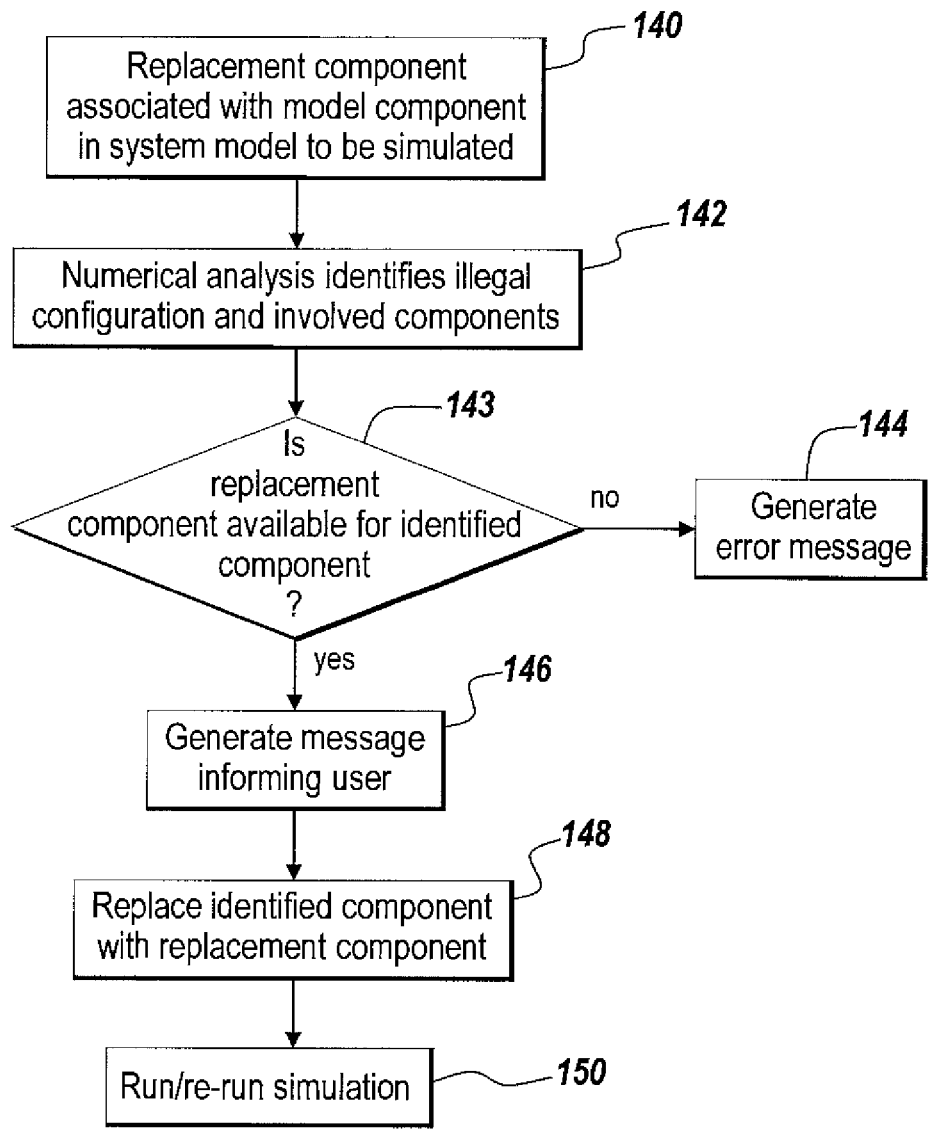
FIG. 5 is a flowchart of a sequence of steps followed by the illustrative embodiment of the present invention to associate and utilize replacement components for model components that are identified as being part of an illegal configuration.

FIG. 5 is a flowchart of an exemplary sequence of steps followed by the illustrative embodiment of the present invention to associate and utilize replacement components for model components that are identified as being part of an illegal configuration. The sequence begins when a replacement component is associated with a model component of a system to be simulated (step 140). Subsequently, when a numerical analysis identifies an illegal configuration and the involved components (step 142), a determination is made (step 143) as to whether a replacement component is available for the component identified as involved in the illegal configuration. If no replacement component is available, an error message is generated (step 144). If a replacement component is available, a message may be generated informing the user (step 146) and the identified component may be replaced by the replacement component (step 148). Alternatively, the replacement may take place without notice to the user or may wait for the user's approval. The simulation may then be run or re-run on the model that includes the replacement component (step 150).

In another aspect of the present invention, symbolic analysis may be used to diagnose and report errors in linear and non-linear systems. As noted above, structural analysis considers what variables participate in which equations. Structural analysis discards information that indicates how the variables participate in each equation. In contrast, symbolic analysis, like numerical analysis, utilizes the information that indicates how the variables participate in each equation. The techniques of the present invention that were described above may be extended to use symbolic analysis to diagnose and report errors for non-linear systems.

For example, in one implementation of the present invention, each equation in a non-linear system may be represented as an abstract syntax tree (AST). With symbolic analysis, variables and equations may be eliminated by rearranging an equation such that one variable is written explicitly as a function or new expression of other variables. The one variable is eliminated from the system of equations by substituting the new expression everywhere the one variable appears. Non-independent sets of equations arise when a variable substitution yields a trivial or inconsistent equation, e.g., 0=7. As in the case of the numeric analysis techniques discussed above, the discovery of a dependent equation triggers the generation of an error message.

It will be appreciated that although the examples discussed above have discussed the numerical equations as corresponding to either a system model component or to a topology equation for the system model, the numerical equations may also correspond to other types of equations associated with the system model. For example, the numerical equations may correspond to an equation that affects the environment in which the model operates or may correspond to a dynamic equation associated with the model that changes during simulation. In the case of errors identified after performing a numerical analysis of an equation not associated with a particular model component or the topology of the system model, a general error message may be provided to the user.

Those skilled in the art will recognize that additional implementations related to those described above are also possible within the scope of the present invention. For example, in one implementation, the numerically-based technique of the present invention enables diagnosis information to be provided for problems during a simulation that occur only in a certain range of operation of the component (e.g., if an ideal diode it acts like a 0-valued voltage source when the current is positive and a 0-valued current source otherwise). Likewise, the numerical analysis of the present invention may be utilized to find dependencies in presenting equations to explicit solvers when there are state constraints. Similarly, the model components may be listed as hierarchical names to which the dependency-coefficient information from the numerical analysis can be mapped when providing an error message to the user about a detected illegal configuration.

The present invention may be provided as one or more computer-readable programs embodied on or in one or more mediums. The mediums may be a floppy disk, a hard disk, a compact disc, a digital versatile disc, a flash memory card, a PROM, a RAM, a ROM, or a magnetic tape. In general, the computer-readable programs may be implemented in any programming language. Some examples of languages that can be used include MATLAB, FORTRAN, C, C++, C#, or JAVA. The software programs may be stored on or in one or more mediums as object code.

Since certain changes may be made without departing from the scope of the present invention, it is intended that all matter contained in the above description or shown in the accompanying drawings be interpreted as illustrative and not in a literal sense. Practitioners of the art will realize that the sequence of steps and architectures depicted in the figures may be altered without departing from the scope of the present invention and that the illustrations contained herein are singular examples of a multitude of possible depictions of the present invention.

We claim:

1. A method comprising:
analyzing a matrix, where:
the matrix corresponds to a plurality of numerical equations, and
the analyzing is performed by a processor;
the analyzing comprises:
factoring the matrix into a full column rank matrix and at least one staircase upper triangular matrix;
identifying an illegal configuration in a system model, where the identifying:
is based on the analyzing, and
is performed by the processor;
selecting a numerical equation from the plurality of numerical equations;
identifying the illegal configuration by operating on the matrix, the identifying comprising:
determining that the selected numerical equation is linearly dependent on another equation of the plurality of numerical equations; and
indicating that the system model contains the illegal configuration, the indicating based on the determining.

2. The method of claim 1, wherein the full column rank matrix comprises orthogonal columns.

3. The method of claim 1, wherein the full column rank matrix is non-singular.

4. The method of claim 1, wherein the full column rank matrix is non-singular and the factoring the matrix further comprises:
transforming the matrix into a reduced-row echelon form.

5. The method of claim 4, wherein the analyzing further comprises: removing zero rows of the at least one staircase upper triangular matrix and removing corresponding columns of the full column rank matrix.

6. The method of claim 1, wherein the matrix is a Jacobian matrix.

7. A method comprising:
   interacting with a matrix, where:
      the matrix corresponds to a plurality of numerical equations, and
      the analyzing is performed by a processor;
   analyzing the matrix, the analyzing comprising:
      multiplying an intermediate matrix comprising a transpose of the matrix by at least one full column rank matrix to determine at least one staircase upper triangular matrix,
      where the analyzing is performed by the processor;
   identifying an illegal configuration in a system model, where the identifying:
      is based on the analyzing, and
      is performed by the processor;
   selecting a numerical equation from the plurality of numerical equations;
   identifying the illegal configuration by operating on the matrix, the identifying comprising:
      determining that the selected numerical equation is linearly dependent on another equation of the plurality of numerical equations; and
   indicating that the system model contains the illegal configuration, the indicating based on the determining.

8. The method of claim 7, wherein the analyzing further comprises:
   multiplying an inverse of a first matrix having step columns of the at least one staircase upper triangular matrix with a second matrix having non-step columns of the at least one staircase upper triangular matrix to determine a dependency matrix.

9. A method comprising:
   interacting with a matrix, where:
      the matrix corresponds to a plurality of numerical equations, and
      the analyzing is performed by a processor;
   analyzing the matrix, the analyzing comprising:
      multiplying an intermediate matrix comprising a transpose of the matrix by at least one full column rank matrix to determine at least one staircase upper triangular matrix,
      multiplying an inverse of a first matrix having step columns of the at least one staircase upper triangular matrix with a second matrix having non-step columns of the at least one staircase upper triangular matrix to determine a dependency matrix, and
      determining whether an index of the dependency matrix exceeds a threshold value,
      where the analyzing is performed by the processor;
   identifying an illegal configuration in a system model, where the identifying:
      is based on the analyzing, and
      is performed by the processor;
   selecting a numerical equation from the plurality of numerical equations;
   identifying the illegal configuration by operating on the matrix, the identifying comprising:
      determining that the selected numerical equation is linearly dependent on another equation of the plurality of numerical equations; and
   indicating that the system model contains the illegal configuration, the indicating based on the determining.

10. The method of claim 9, wherein the threshold value is zero.

11. A non-transitory computer-readable medium for storing one or more executable instructions, the instructions comprising:
   one or more instructions that, when executed by a processor of a device, cause the processor to:
      analyze a matrix corresponding to a plurality of numerical equations;
      wherein the analyzing the matrix comprises factoring the matrix into a full column rank matrix and at least one staircase upper triangular matrix;
      select a numerical equation from the plurality of numerical equations;
      identify an illegal configuration in a system model related to the matrix, the identifying based at least in part on the analyzing, the identifying comprising:
         determining that the selected numerical equation is linearly dependent on another equation of the plurality of numerical equations; and
      indicate that the system model contains the illegal configuration based at least in part on the determining.

12. The medium of claim 11, wherein the full column rank matrix comprises orthogonal columns.

13. The medium of claim 11, wherein the full column rank matrix is non-singular.

14. The medium of claim 13, wherein the one or more instructions comprise:
   one or more instructions that, when executed by the processor of the device, cause the processor to:
      transform the matrix into a reduced-row echelon form.

15. The medium of claim 14, wherein the one or more instructions comprise:
   one or more instructions that, when executed by the processor of the device, cause the processor to:
      remove zero rows of the at least one staircase upper triangular matrix; and
      remove corresponding columns of the full column rank matrix.

16. A computing device, comprising:
   a processor configured to:
      analyze a matrix, where:
         the matrix corresponds to a plurality of numerical equations,
         the analyzing comprises:
            factoring the matrix into a full column rank matrix and at least one staircase upper triangular matrix;
      identify an illegal configuration in a system model, where the identifying:
         is based on the analyzing, and
         is performed by the processor;
      select a numerical equation from the plurality of numerical equations;
      identify the illegal configuration by operating on the matrix, the identifying comprising:
         determining that the selected numerical equation is linearly dependent on another equation of the plurality of numerical equations; and
      indicating that the system model contains the illegal configuration, the indicating based on the determining.

* * * * *